(12) United States Patent
Yoo

(10) Patent No.: US 7,279,360 B2
(45) Date of Patent: Oct. 9, 2007

(54) SEMICONDUCTOR DEVICE AND METHOD OF PACKAGING THE SAME

(75) Inventor: Cheol-Joon Yoo, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/536,270

(22) Filed: Sep. 28, 2006

(65) Prior Publication Data

US 2007/0049002 A1    Mar. 1, 2007

Related U.S. Application Data

(62) Division of application No. 10/753,827, filed on Jan. 5, 2004, now Pat. No. 7,129,585.

(30) Foreign Application Priority Data

Jan. 30, 2003    (KR)    ............... 2003-06369

(51) Int. Cl.
    *H01L 21/44*    (2006.01)
(52) U.S. Cl. ...................... 438/108; 438/613
(58) Field of Classification Search ............... 438/108, 438/613
    See application file for complete search history.

(56) References Cited

U.S. PATENT DOCUMENTS 6,300,234 B1 * 10/2001 Flynn et al. ............... 438/612
6,794,750 B2    9/2004 Matsuda
6,936,532 B2 *  8/2005 Sakaida ...................... 438/616
6,972,381 B2   12/2005 Hashimoto
7,060,528 B2 *  6/2006 Nishikawa et al. ......... 438/110

FOREIGN PATENT DOCUMENTS

JP        9-97815       4/1997
KR     2002-0042486     6/2002

OTHER PUBLICATIONS

English language abstract of Japanese Publication No. 9-97815.
English language abstract of Korean Publication No. 2002-0042486.

* cited by examiner

*Primary Examiner*—Roy Karl Potter
(74) *Attorney, Agent, or Firm*—Marger Johnson & McCollom, P.C.

(57) ABSTRACT

Embodiments of the invention provide a semiconductor-chip mounting body, a semiconductor device including the mounting body, and a method of packaging the semiconductor device. According to some embodiments, when a semiconductor chip is mounted on the mounting body as a flip-chip type, an encapsulation process using an encapsulation resin is not required. In some embodiments, the mounting body includes a substrate formed of a polyimide film, a conductive pattern formed of copper, a protection layer pattern formed of PSR, and an adhesive pattern formed on the protection layer pattern. The adhesive pattern can be formed of an insulating material. A plurality of holes, into which a plurality of bumps formed on the semiconductor chip are inserted to be connected to the conductive pattern, are formed in the protection layer pattern and the adhesive pattern.

1 Claim, 3 Drawing Sheets

SEMICONDUCTOR DEVICE AND METHOD OF PACKAGING THE SAME

CROSS REFERENCE TO RELATED APPLICATIONS

This application is a Divisional of U.S. patent application Ser. No. 10/753,827, filed on Jan. 5, 2004, now U.S. Pat. No. 7,129,585, which claims priority from Korean Patent Application No. 2003-06369, filed on Jan. 30, 2003, in the Korean Intellectual Property Office, the disclosure of which is hereby incorporated by reference in its entirety.

BACKGROUND OF THE INVENTION

1. Field of the Invention

This disclosure relates to a semiconductor device and a method of packaging the same. More particularly, this disclosure relates to a semiconductor-chip mounting body, on which a semiconductor chip is mounted as a flip-chip type to be connected to and encapsulated on the mounting body, a semiconductor device including the mounting body, and a method of packaging the semiconductor device.

2. Description of the Related Art

A semiconductor packaging process is performed to electrically connect a semiconductor chip to external elements and also protect the semiconductor chip from the outside environment. To attain these objects, conventional packaging processes include a connection process and an encapsulation process. However, in recent years, as more electric appliances employ semiconductor devices and semiconductor chips become more varied in size, shape, and performance, new methods of packaging semiconductor chips, including the connection and encapsulation processes, have been developed.

Nowadays, there are various and broadly used packages for densely mounting semiconductor chips, ranging from a dual inline package (DIP), a small outline package (SOP), a quad flat package (QFP), and a ball grid array (BGA), to a chip scale package (CSP), which is a more upgraded package. In addition, a wafer-level CSP and a technique for direct-chip-attach (DCA) mounting bare chips are being developed in order to make electric appliances thinner, smaller, and lighter.

A flip chip technique has also been developed to enable diversification of appliances and to mount semiconductor chips in a highly dense manner. In a broad sense, the flip chip technique refers to a method of turning a semiconductor chip upside down to make a chip pad opposite to a substrate and electrically and mechanically connect the semiconductor chip with the substrate. In a narrow sense, the flip chip technique refers to a method of packaging bare chips upside down. In this disclosure, the flip chip technique refers to the former, broad sense of the term.

FIG. 1A is a schematic cross-sectional diagram illustrating a conventional mounting body for connecting as a flip-chip type and encapsulating a semiconductor chip.

Referring to FIG. 1A, the conventional mounting body 100 comprises a substrate 110, a conductive pattern 120, and a protection layer 130. The substrate 110 may be formed of various materials in diverse shapes. For example, the substrate 110 may be a typical printed circuit board, a chip-on-glass (COG)-type glass substrate, or a substrate formed of a polyimide film used for tape automated bonding (TAB) or tape carrier package (TCP).

The conductive pattern 120 is disposed on the substrate 110 to electrically connect a bonding pad of a semiconductor chip and an external element. The conductive pattern 120 is typically formed of copper (Cu) but it is also possible to use aluminum (Al) or gold (Au). The shape of the conductive pattern 120 depends on the arrangement of bumps formed on a semiconductor chip to be connected to and mounted on the mounting body and also on the electrical properties of the substrate 110. Since the bumps are normally disposed on both sides of the semiconductor chip, the conductive pattern 120 is not formed in vacancies between the bumps in the center of the top surface of the substrate 110. The vacancies between the bumps will be filled with under-filling material in a subsequent process.

Thereafter, the protection layer 130 is formed on the conductive pattern 120. The protection layer 130 is formed of photo sensitive resist (PSR) or the like. To protect the conductive pattern 120, the protection layer 130 is formed not only on the top surface of the conductive pattern 120 but also on lateral vacancies thereof. However, the protection layer 130 is not formed in a portion of the conductive pattern 120 such that the bumps formed on the semiconductor chip contact the portion of the conductive pattern 120. Thus, the portion of the conductive pattern 120 is exposed.

FIG. 1B is a schematic cross-sectional diagram illustrating a conventional semiconductor device 100', in which a semiconductor chip 140 is mounted on the mounting body 100 of FIG. 1A. Referring to FIG. 1B, a plurality of bumps 150 are formed on a side of the semiconductor chip 140 where a circuit is formed, i.e., a pad (not shown) is positioned.

Generally, a bump refers to a conductive protrusion used for connecting a semiconductor chip to a substrate or directly connecting the semiconductor chip and a printed circuit board. This bump can increase the height of an electrode so as to aid mounting a flip chip and makes it easier to connect the electrode to an external electrode. Such a bump may be formed in a ball shape or a square pillar shape. The bumps 150 are connected to the conductive pattern 120 through the exposed portion of the conductive pattern 120, which is not protected by the protection layer 130.

Regions where the bumps 150 are connected to the conductive pattern 120 are protected from the outside environment through an encapsulation process. By the encapsulation process, a liquid encapsulation resin 160 encloses the bumps 150 and the exposed conductive pattern 120. Also, the encapsulation resin 160 forms an under-fill at the bottom of the semiconductor chip 140.

The encapsulation resin 160 protects the bumps 150 and adheres the semiconductor chip 140 to the mounting body 100 through the under-fill. Since the liquid encapsulation resin 160 is hardened later, the mounting body 100 and the semiconductor chip 140 can be firmly adhered. However, if the encapsulation resin 160 is not sufficient for adhesion, an additional adhesive may be used.

Embodiments of the invention address these and other limitations of the prior art.

SUMMARY OF THE INVENTION

Some embodiments of the invention provide a semiconductor-chip mounting body requiring no additional encapsulation resin for protecting a connection portion between bumps and a conductive pattern, and a semiconductor device including the same. Since a conventional encapsulation process using an encapsulation resin in a separate, subsequent process is not required, the process of mounting a semiconductor chip can be simplified.

Some embodiments of the invention also provide an adhesive pattern that includes holes into which the bumps can be inserted. Thus, a conventional conductive adhesive is not required, and insulative adhesives may be used for improved physical and chemical characteristics.

Other embodiments of the invention provide a method of packaging a semiconductor device, which can reduce the time and cost by simplifying an assembly process of a semiconductor chip and a mounting body.

BRIEF DESCRIPTION OF THE DRAWINGS

The features of the invention will become more apparent by describing in detail preferred embodiments thereof with reference to the attached drawings.

DETAILED DESCRIPTION OF THE INVENTION

Figure 1A:
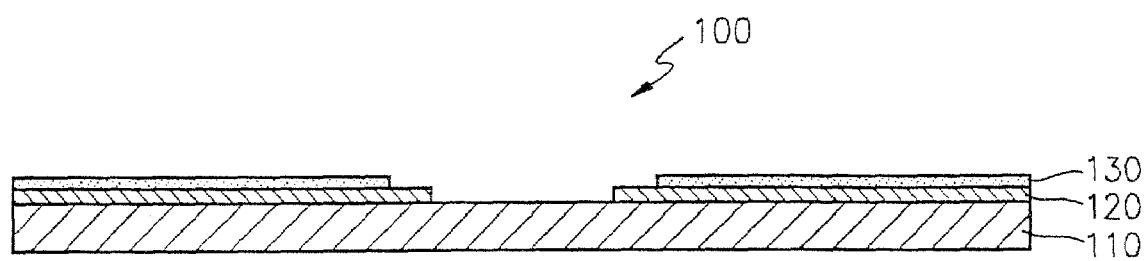
FIG. 1A is a schematic cross-sectional diagram illustrating a conventional mounting body for connecting as a flip-chip type and encapsulating a semiconductor chip.
Figure 1B:
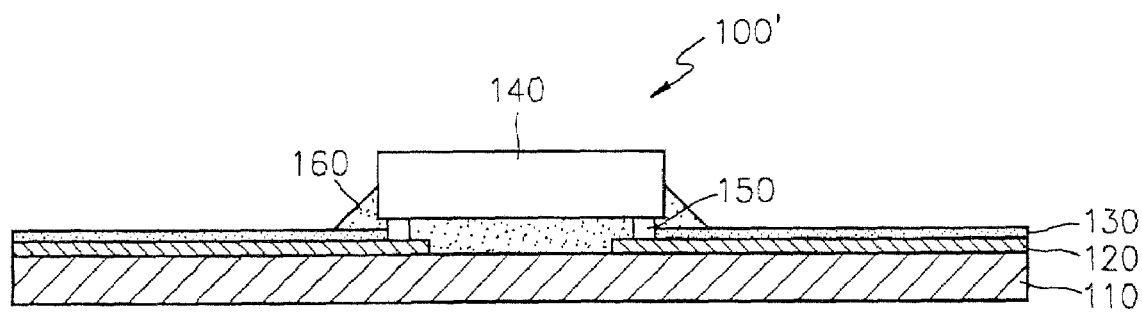
FIG. 1B is a schematic cross-sectional diagram illustrating a conventional semiconductor device, in which a semiconductor chip is mounted as a flip-chip type on the mounting body of FIG. 1A.

The invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the thicknesses of layers may be exaggerated for clarity, and the same reference numerals are used to denote the same elements throughout the drawings.

Figure 2A:
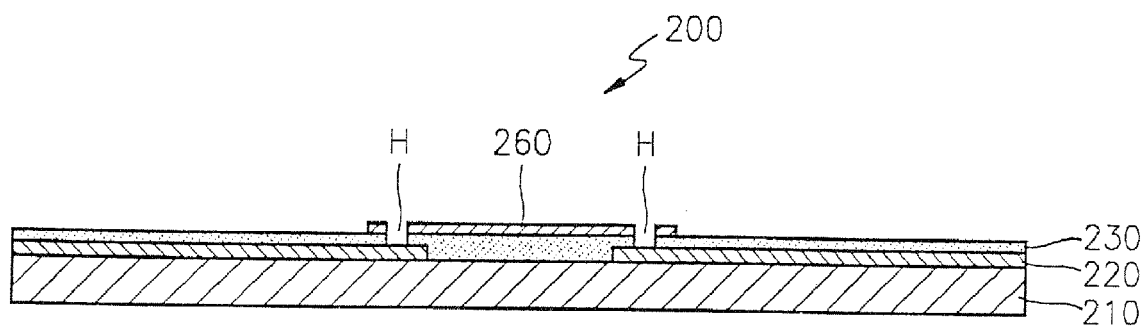
FIG. 2A is a schematic cross-sectional diagram illustrating a mounting body according to some embodiments of the invention, on which a semiconductor chip is mounted as a flip-chip type.
Figure 2B:
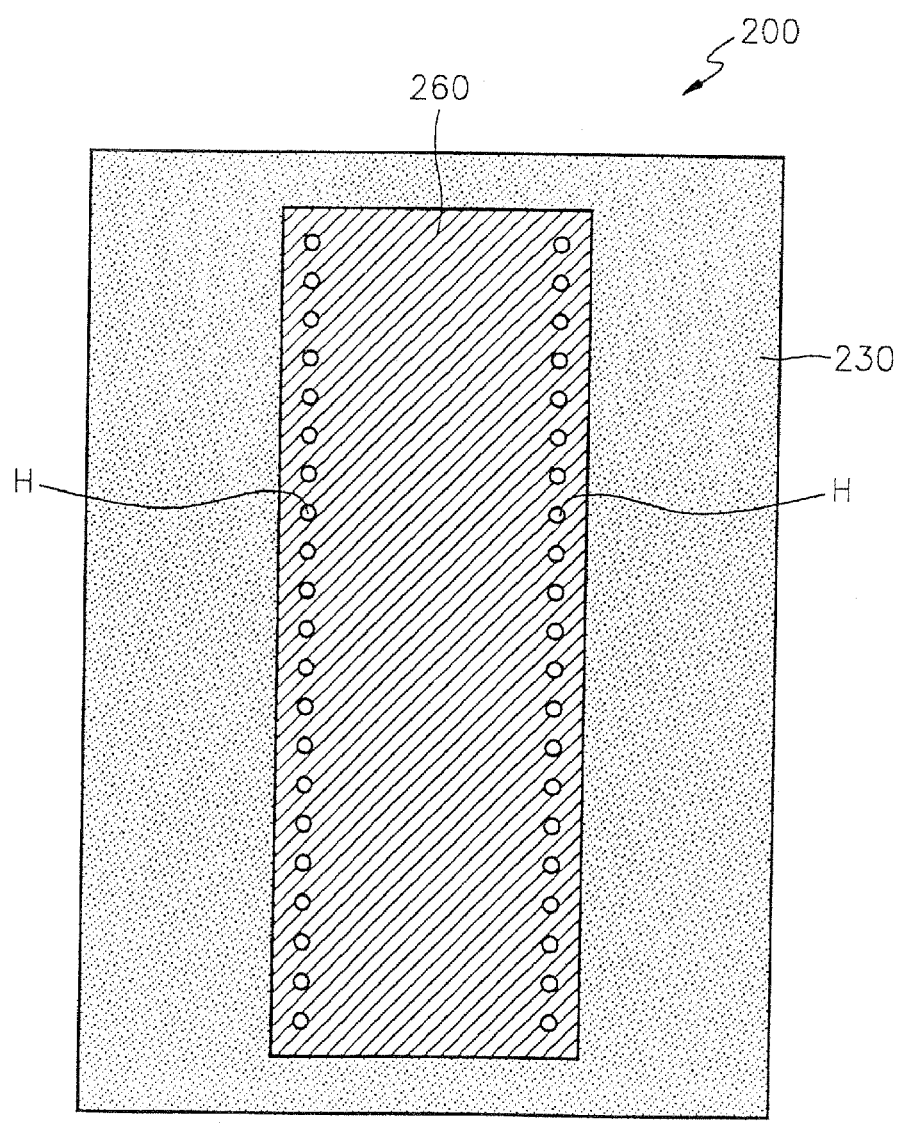
FIG. 2B is a schematic plan diagram illustrating the mounting body of FIG. 2A.

FIG. 2A is a schematic cross-sectional diagram illustrating a mounting body on which a semiconductor chip is mounted as a flip-chip type, according to some embodiments of the invention. FIG. 2B is a schematic plan view diagram illustrating the mounting body of FIG. 2A.

Referring to FIGS. 2A and 2B, a mounting body 200 includes a substrate 210, a conductive pattern 220, a protection layer pattern 230, and an adhesive pattern 260. A semiconductor chip will be connected to the top surface of the mounting body 200 as a flip-chip type and encapsulated. Generally, before a packaging process is carried out, the mounting body 200 is fabricated in another process unit and then supplied to a packaging process unit.

The substrate 210 may be, for example, one of a typical printed circuit board, a COG-type glass substrate, and a COF-type, TAB-type, or TCP-type polyimide film substrate. Also, the substrate 210 may be formed to diverse sizes using various materials. For instance, the substrate 210 may be a printed circuit board formed of hardboard, a glass substrate, a flexible printed circuit film, or a tape-shaped substrate. In addition, the substrate 210 may have almost the same size as that of a semiconductor chip to be mounted, in the same manner as applied to a CSP.

Like in a typical flip-chip-type mounting body, the conductive pattern 220 is formed on the substrate 210. The conductive pattern 220 electrically connects a pad of a semiconductor chip, which will be mounted in a packaging process, to an external electric element. The conductive pattern 220 is formed of a conductive material and selected considering adjacent elements, such as a semiconductor chip and a substrate, specifically, considering physical characteristics such as the rate of thermal expansion and chemical characteristics such as chemical reactions to the adjacent elements. For example, the conductive pattern 220 is formed of copper (Cu). The shape of the conductive pattern 220 may vary according to the number and arrangement of bumps formed on a semiconductor chip, which will be connected to, encapsulated, and mounted on the mounting body, and also to correlation between adjacent electric elements.

Next, the protection layer pattern 230 is formed on the conductive pattern 220. Like in the conventional mounting body, the protection layer pattern 230 protects the conductive pattern 220 underneath and can be formed of photo sensitive resist (PSR).

However, according to some embodiments of the invention, a plurality of holes H are formed in the protection layer pattern 200 of the mounting body 200. A portion of the conductive pattern 220 is exposed through the holes H. FIG. 2B is a plan diagram illustrating the shape of the protection layer pattern 230 according to some embodiments of the invention. In FIG. 2B, the holes H are formed in the protection layer pattern 230 in the same pattern as holes formed in the adhesive pattern 260.

Preferably, the pattern of the holes H is identical to that of the bumps formed on a semiconductor chip that is mounted at a later time. The semiconductor chip can be electrically connected to the conductive pattern 220 through the bumps inserted into the holes H. Also, the protection layer pattern 230 may be formed in the center of the top surface of the substrate 210, in the area where an under-fill is formed using a conventional mounting body.

Next, referring to FIGS. 2A and 2B, the adhesive pattern 260 is formed on the protection layer pattern 230. The upper surface area of the adhesive pattern 260 is preferably larger than that of a semiconductor chip that is connected and encapsulated at a later time. Also, holes H are formed in the adhesive pattern 260 in the same pattern as the pattern of the bumps formed on the semiconductor chip that is mounted at a later time.

The adhesive pattern 260 is needed to adhere the semiconductor chip to the mounting body 200. Thus, in the area where the holes H are formed, the adhesive pattern 260 may be formed of an isotropic conductive film, an anisotropic conductive film (ACF), or an anisotropic conductive adhesive (ACA) film. Alternatively, the adhesive pattern 260 may be a tape-shaped adhesive where holes H are formed.

As mentioned above, the adhesive pattern 260 of the invention is preferably an insulating material. Since the bumps formed on a semiconductor chip are inserted into the holes H formed in the adhesive pattern 260 and connected to the conductive pattern 220, it is unnecessary to form the adhesive pattern 260 of a conductive material. Rather, if the adhesive pattern 260 is formed of an insulating material, it is not likely that current leakage through the adhesive pattern 260 or a short between the adhesive pattern 260 and other conductive elements will occur.

Further, since the adhesive pattern 260 can be formed of one of a variety of insulating materials, it is possible to achieve excellent physical and chemical characteristics between the adhesive pattern 260 and the semiconductor chip or the substrate 210.

Also, the adhesive pattern 260 according to embodiments of the invention functions not only as an adhesive but also as a substitute for an encapsulation resin. Conventionally, an additional encapsulation resin is used to protect a connection portion between the bumps and the conductive pattern 260. However, according to embodiments of the invention, the adhesive pattern 260 is used also as an encapsulation material.

An example of a method of fabricating the mounting body is as follows.

To begin, the protection layer pattern 230 with the holes H is formed on the conductive pattern 220, which is formed on the substrate 210. The protection layer pattern 230 may be formed not only on the conductive pattern 220 but also on a portion of the substrate 210 where the conductive pattern 220 is not disposed. The protection layer pattern 230 may be formed by forming a protection layer, and then patterning the holes H in the protection layer. Alternatively, a protection layer pattern 230 with pre-formed holes H may be adhered to the substrate 210.

Next, the adhesive pattern 260 is formed on the protection layer pattern 230. For example, the adhesive pattern 260 may be formed by attaching a tape-shaped or film-shaped adhesive to the protection layer pattern 230. Here, the adhesive must be attached to the protection layer pattern 230 such that the holes H formed in the adhesive pattern 260 overlap the holes H formed in the protection layer pattern 230 disposed thereunder. As a result, the mounting body 200 including the conductive pattern 220, the protection layer pattern 230, and the adhesive pattern 260 is completed.

Hereinafter, a semiconductor device including the mounting body 200 and a method of packaging the same will be described.

Figure 3A:
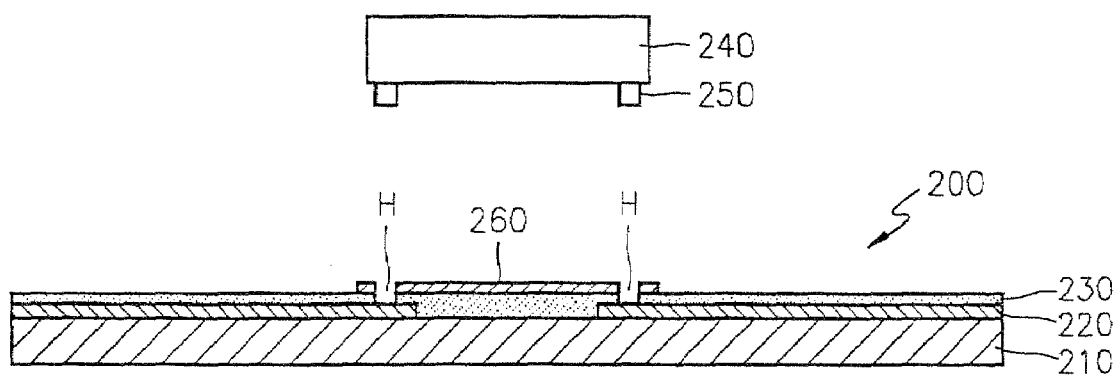
FIG. 3A is a schematic cross-sectional diagram illustrating a semiconductor chip and the mounting body of FIGS. 2A-2B before the semiconductor chip is attached to the mounting body.
Figure 3B:
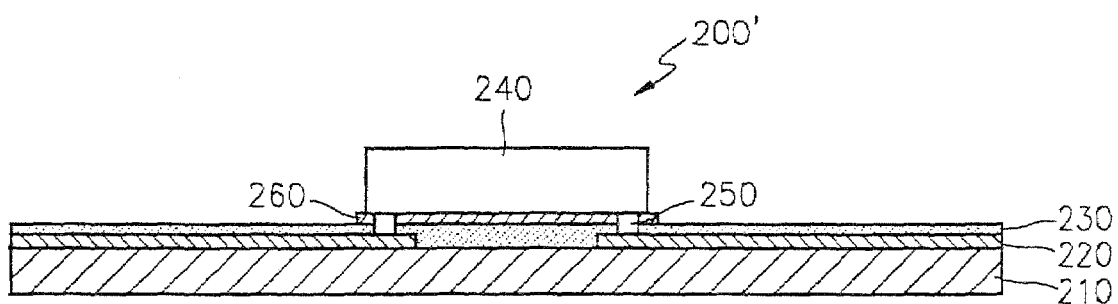
FIG. 3B is a schematic cross-sectional diagram illustrating the semiconductor chip and the mounting body of FIGS. 2A-2B after the semiconductor chip is attached to the mounting body.

FIG. 3A is a schematic cross-sectional diagram illustrating a semiconductor chip and the mounting body of FIGS. 2A-2B before the semiconductor chip is mounted on the mounting body. FIG. 3B is a schematic cross-sectional diagram illustrating the semiconductor chip and the mounting body of FIGS. 2A-2B after the semiconductor chip is mounted on the mounting body and connected and encapsulated according to embodiments of the invention.

Referring to FIG. 3A, a mounting body and a semiconductor chip 240 to be connected to and encapsulated on the mounting body are illustrated. A pad (not shown) is formed on one side of the semiconductor chip 240, and bumps 250 are attached to the top surface of the pad. According to these embodiments, since the semiconductor chip 240 is mounted on the mounting body as a flip-chip type, the surface where the bumps 250 are formed faces the mounting body. The bumps 250 formed on the semiconductor chip 240 may have a ball shape or a square pillar shape.

To package a semiconductor device 200' including the mounting body, the bumps 250 are initially inserted into holes H. Here, the bumps 250 must be precisely aligned with the holes H. Preferably, the bumps 250 are completely inserted into the holes H and thus directly connected to a conductive pattern 220.

Next, a heating process and a pressing process are performed to the semiconductor chip 240 and/or the substrate 210. Thus, the bumps 250 can be completely inserted into the holes H and connected to the conductive pattern 220, and the semiconductor chip 240 can be completely attached to the mounting body through the adhesive pattern 260. Also, the pressing process enables reliable connection between the bumps 250 and the conductive pattern 220.

Once the heating process and pressing process start, the adhesive for the adhesive pattern 260 becomes slightly fluid and softens, and after the processes are completed, it is hardened. When the adhesive becomes slightly fluid and softens, the contact area between the bumps 250 and the conductive pattern 220 can be increased and reliable adhesion therebetween is enabled. Thus, vacancies are minimized between the bumps 250 and the conductive pattern 220.

If the heating process and pressing process are performed, a conventional encapsulation process for coating an encapsulation resin is not required. As described above, this is because the adhesive pattern 260 can adhere the semiconductor chip 240 to the mounting body as well as encapsulate a connection portion therebetween. Also, the mounting body is fabricated in another process unit and then supplied to a packaging process unit. Thus, the packaging process becomes markedly simpler, thereby improving the efficiency, shortening the time, and reducing the cost.

FIG. 3B shows the semiconductor device 200' where the semiconductor chip is packaged. The semiconductor device 200' includes the mounting body 200, the semiconductor chip 240, and bumps 250. The mounting body 200 includes the substrate 210, the conductive pattern 220, and the protection layer pattern 230.

In an embodiment of the invention, when the substrate 210 is formed of a flexible printed circuit film, the semiconductor device 200' is a COF-type device. The semiconductor chip 240 is adhered to the mounting body through the adhesive pattern 260, and a connection portion between the bumps 250 and the conductive pattern 220 is encapsulated by the adhesive pattern 260 and thus protected from the outside environment.

According to embodiments of the invention, when a semiconductor chip is mounted as a flip-chip type and connected to and encapsulated on a mounting body, an additional encapsulation resin is not required to encapsulate a connection portion between bumps and a conductive pattern. Thus, a packaging process can be simplified, thereby reducing the time and the cost.

Furthermore, since an adhesive may not be a conductive material, other various materials can be used as the adhesive to improve the rate of thermal expansion or the adhesion. Also, because an insulating material can be used as the adhesive, leakage currents or shorts between the adhesive and other conductive elements can be prevented.

Embodiments of the invention will now be described in a non-limiting way.

In accordance with an aspect of the invention, there is provided a mounting body, on which a semiconductor chip including a plurality of bumps is connected as a flip-chip type and encapsulated. The mounting body includes a substrate, a conductive pattern which will be connected to the bumps and is formed on the substrate, a protection layer pattern which includes holes exposing the conductive pattern, into which the bumps are inserted to be connected to the conductive pattern, and is formed on the substrate and the conductive pattern, and an adhesive pattern which includes holes formed in the same pattern as the holes formed in the protection layer pattern and is formed on the protection layer pattern. The mounting body of the invention requires no additional encapsulation resin for protecting a connection portion between the bumps and the conductive pattern. Also, since the adhesive pattern includes the holes, into which the bumps can be inserted, no conductive adhesive is needed. Further, an encapsulation process using an encapsulation resin is not used as a subsequent process and thus a packaging process of mounting a semiconductor chip can be simplified.

The substrate may be formed of a flexible material or a polyimide film. Alternatively, the substrate may be a glass substrate.

The conductive pattern may be formed of copper (Cu), and the protection layer pattern may be formed of photo sensitive resist (PSR).

The adhesive pattern has a tape shape or a film shape and is preferably attachable and detachable. Also, the adhesive pattern may be formed of a material that is hardened by heating and pressing and also an insulating material.

In accordance with another aspect of the invention, there is provided a semiconductor device including a semiconductor chip including a plurality of bumps and a mounting body on which the semiconductor chip is connected as a flip-chip type and encapsulated. The semiconductor chip is adhered to the mounting body and encapsulated through an adhesive pattern included in the mounting body. Here, the mounting body may be one of the foregoing semiconductor-chip mounting bodies.

The bumps may be formed of gold. Also, the bumps may be directly connected to the conductive pattern without the medium of another conductive material such as a conductive adhesive.

In accordance with yet another aspect of the invention, there is provided a method of packaging a semiconductor device, in which a semiconductor chip including a plurality of bumps is connected to a mounting body as a flip-chip type and encapsulated and thus mounted on the mounting body. The method includes preparing one of the foregoing semiconductor-chip mounting bodies, mounting a semiconductor chip on the mounting body such that the bumps formed on the semiconductor chip are inserted into holes formed in an adhesive pattern and a protection layer pattern of the mounting body, and heating and pressing the mounting body and/or the semiconductor chip.

The plurality of bumps may be formed of gold.

Also, preparing the mounting body may include forming a protection layer pattern on a substrate and a conductive pattern formed on the substrate to include holes exposing the conductive pattern, into which the bumps are inserted to be connected to the conductive pattern, and forming an adhesive pattern on the protection layer pattern to include holes formed in the same pattern as the holes formed in the protection layer pattern.

I claim:

1. A method comprising:
   forming a substrate;
   forming a conductive pattern on the substrate;
   forming a protection layer pattern with a first plurality of holes that expose the conductive pattern;
   forming an adhesive layer pattern with a second plurality of holes that are aligned with the first plurality of holes;
   mounting a semiconductor chip having a plurality of gold bumps by inserting the plurality of gold bumps through the second plurality of holes and the first plurality of holes to contact the conductive pattern; and
   applying heat and pressure to the substrate, the conductive pattern, the protection layer pattern, the adhesive layer pattern, and the semiconductor chip.

* * * * *